United States Patent [19]

McDonald

[11] Patent Number: 4,869,598
[45] Date of Patent: Sep. 26, 1989

[54] TEMPERATURE-SENSITIVE MULTIPLE-LAYER THIN FILM SUPERCONDUCTING DEVICE

[76] Inventor: Donald G. McDonald, 2440 Kohler Dr., Boulder, Colo. 80303

[21] Appl. No.: 166,670

[22] Filed: Mar. 11, 1988

[51] Int. Cl.$^4$ ................... G01K 7/16; H01L 39/02
[52] U.S. Cl. ........................... 374/176; 307/306; 338/325; 505/847
[58] Field of Search ............ 374/176, 178; 174/158; 5/125.1; 357/28; 335/216; 307/306; 505/842; 338/328

[56] References Cited

U.S. PATENT DOCUMENTS

| | | | |
|---|---|---|---|
| 685,012 | 10/1901 | Testa | 307/306 X |
| 3,267,730 | 8/1966 | Sutterthwaite et al. | 374/176 X |
| 3,350,669 | 10/1967 | Di Leo et al. | 335/216 |
| 3,555,483 | 1/1971 | Tener | 374/176 X |
| 3,646,813 | 3/1972 | Kuznietz et al. | 374/176 |
| 3,790,880 | 2/1974 | Solomon | 336/DIG. 1 X |
| 3,956,727 | 5/1976 | Wolf | 338/32 S |
| 4,095,468 | 6/1978 | Sidor | 374/176 X |
| 4,689,559 | 8/1987 | Hastings et al. | 307/306 X |
| 4,739,382 | 4/1988 | Blouke et al. | 357/28 |

FOREIGN PATENT DOCUMENTS 58-95231  6/1983  Japan .................................. 374/176

OTHER PUBLICATIONS

W. A. Little, "Device Application of Super-Inductors", Proceedings of the Symposium on the Physics of Superconducting Devices, 1967, pp. S1–S17.
R. Meservey and P. M. Tedrow, "Measurement of Kinetic Inductance of Superconducting Linear Structures", Journal of Applied Physics, vol. 40, pp. 2028–2034, (1969).
J. W. Baker, J. D. Lejeune and D. G. Naugle, "Effects of a Nonuniform Current Distribution on the Kinetic Inductance of a Thin Superconducting Film", Journal of Applied Physics, vol. 45, pp. 5043–5049, (1974).
M. V. Moody, H. A. Chan, H. J. Paik, and C. Stephens, "A Superconducting Penetration Depth Thermometer", Proceedings of the 17th International Conference on Low Temperature Physics, edited by U. Eckern, A. Schmid, W. Weber, and H. Wuhl (North-Holland, Amsterdam), 1984, pp. 407–408.

Primary Examiner—Daniel M. Yasich
Attorney, Agent, or Firm—Robert E. Harris

[57] ABSTRACT

A superconducting device is disclosed with the device having multiple layers of thin film configured to achieve highly sensitive measurements based upon temperature. The device is implemented, in simplest form, as a stripline having a ground plane layer of superconductor, a configured layer of superconductor, and a dielectric layer between the ground plane layer and the configured layer. The device is operated at a temperature just below the transition temperature of the superconducting materials utilized so that the inductance of the device depends substantially upon temperatures encountered, with highest sensitivity resulting when at least one of the superconducting layers has a thickness that is small relative to the magnetic penetration depth of the superconducting material utilized.

25 Claims, 3 Drawing Sheets

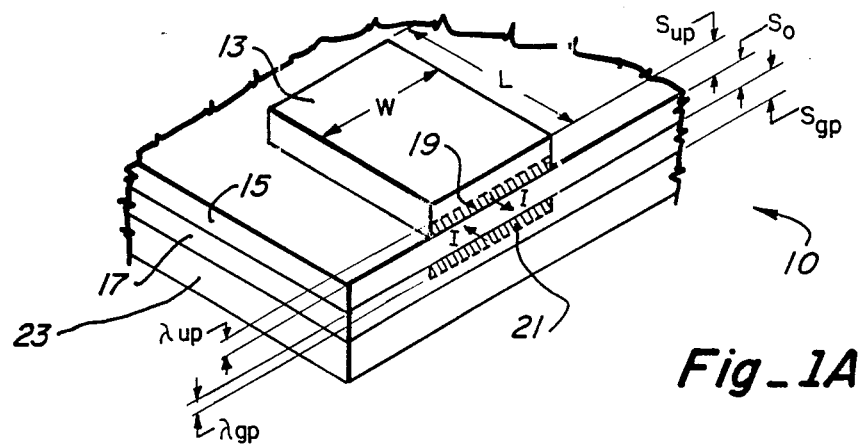
Fig_1A
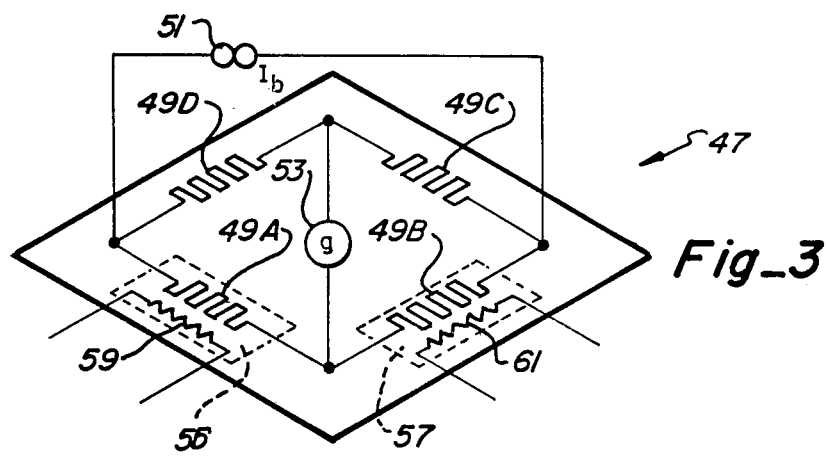
Fig_3
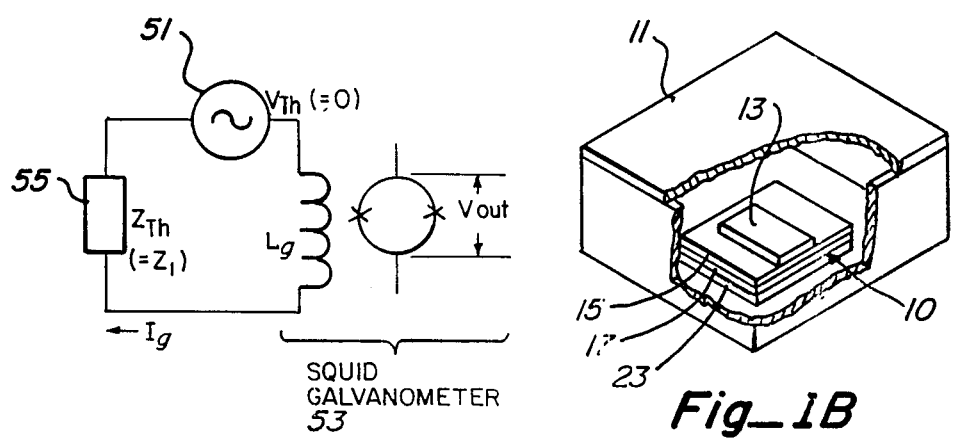
Fig_4
Fig_1B

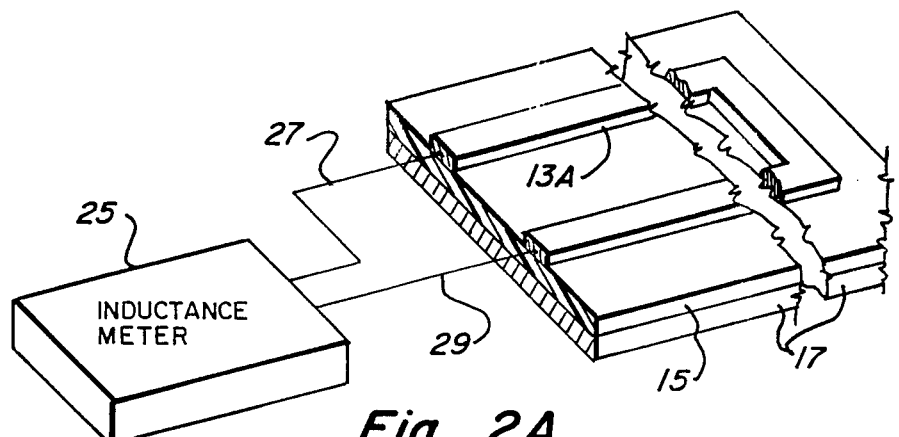
Fig_2A
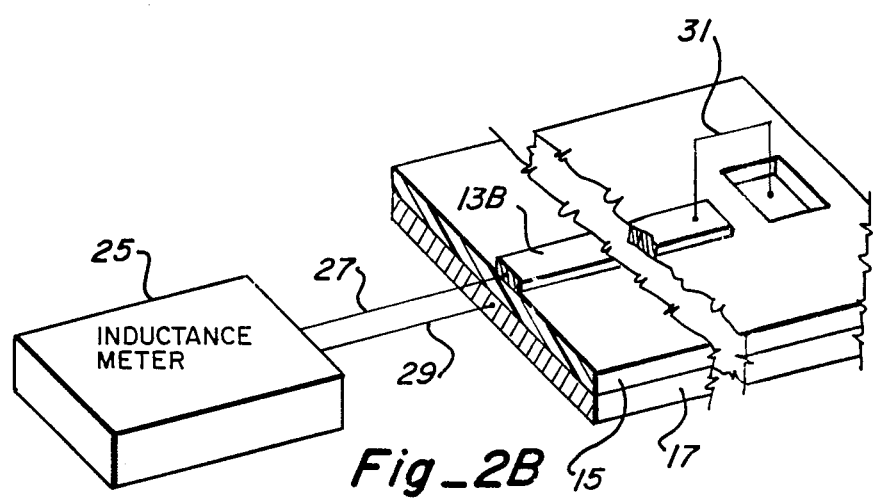
Fig_2B
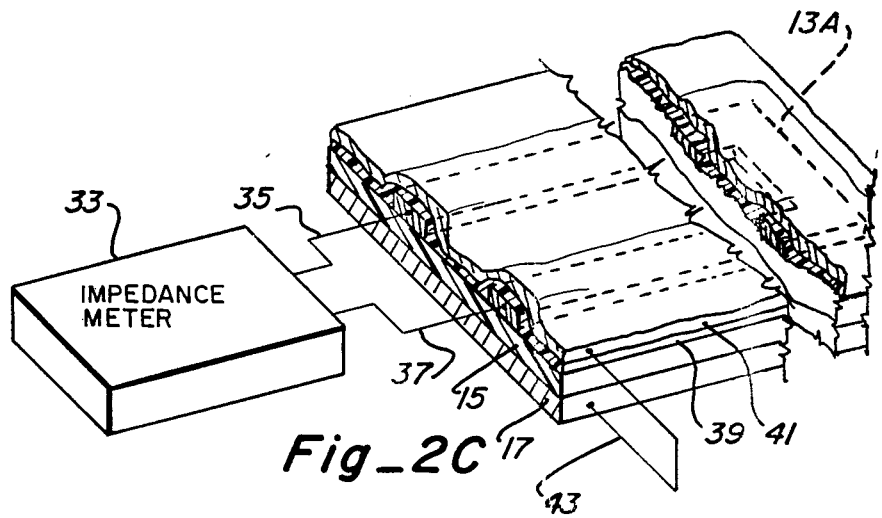
Fig_2C

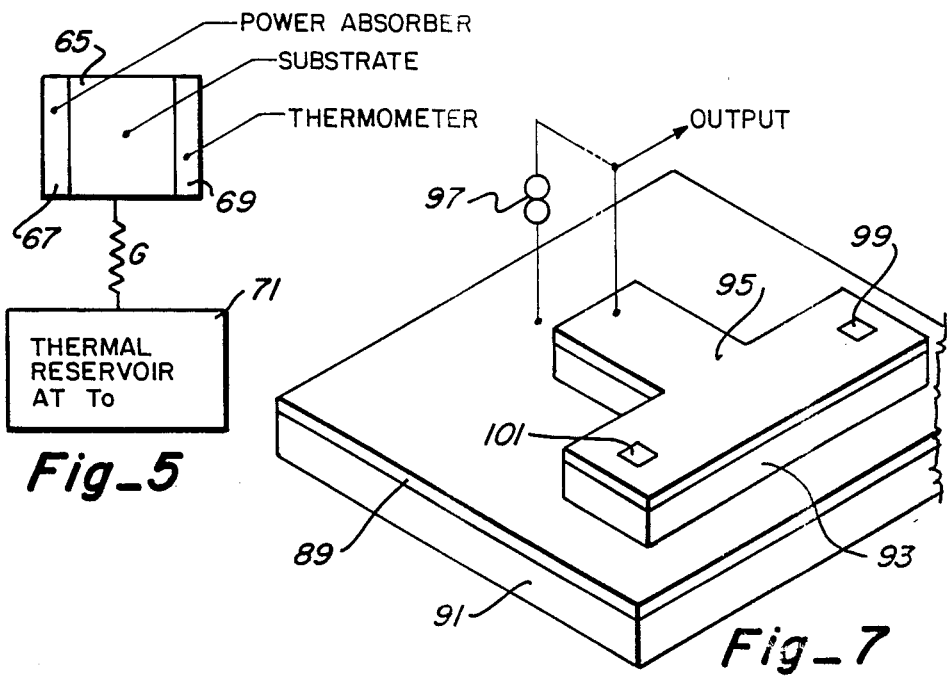
Fig_5
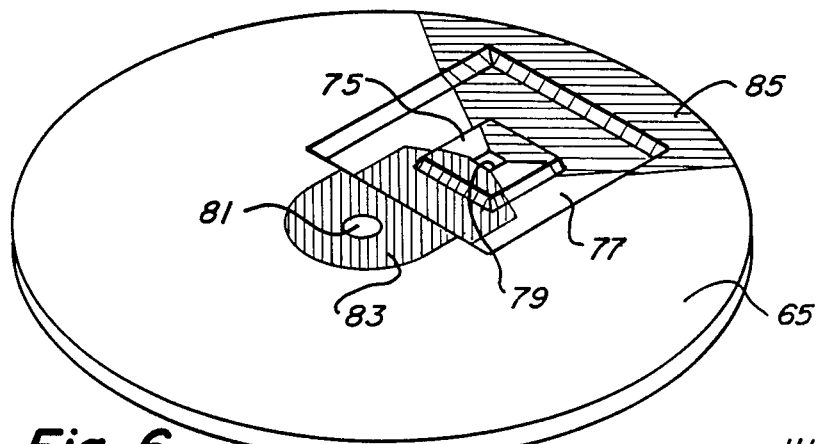
Fig_7
Fig_6
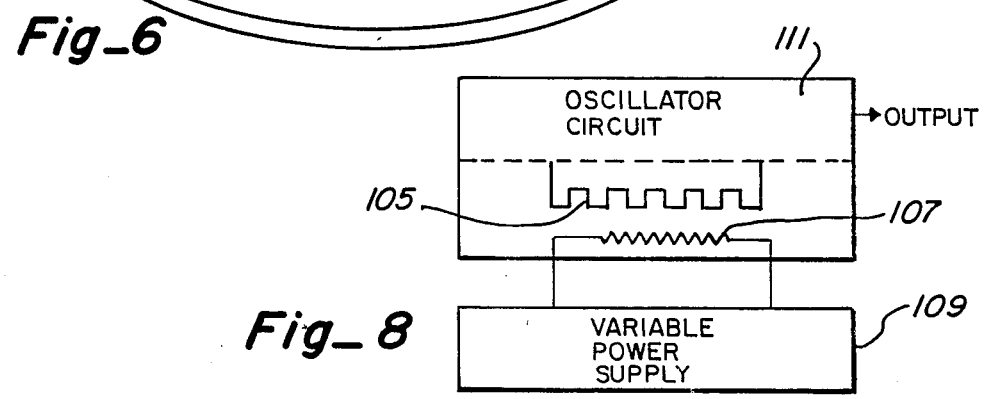
Fig_8

TEMPERATURE-SENSITIVE MULTIPLE-LAYER THIN FILM SUPERCONDUCTING DEVICE

GOVERNMENT INTEREST IN THE INVENTIN

The invention described herein may be manufactured and used by or for the Government of the United States of America for all governmental purposes without the payment of any royalty.

FIELD OF THE INVENTION

This invention relates to a superconducting device, and, more particularly, relates to a temperature-sensitive, multiple-layer thin film superconducting device.

BACKGROUND OF THE INVENTION

Superconductors are commonly known as electrically conducting materials that, below some critical temperature $T_c$, which varies among materials, provide zero electrical resistance for currents imposed upon them. Known example materials are lead, niobium, and aluminum, which have approximate critical temperatures of 7.2, 9.2, and 1.2 degrees Kelvin, respectively. Various metal alloys are also known to exhibit superconductivity, and recently, metal oxides with critical temperatures near 90 degrees Kelvin have also been discovered.

Practical applications of superconductors have used these materials both in wire form and in thin film form. In film form, the thin films are typically deposited on dielectric substrates when used in electronic applications, and typically have thicknesses in the range of 1 nm to 1000 nm.

Superconductors with lower critical temperatures are commonly cooled by liquid helium, while superconductors with higher critical temperatures may be cooled with liquid nitrogen. Alternatively, superconductors can be cooled with various mechanical refrigerators.

The superconducting state in a material can be destroyed by raising the temperature of the material above its critical temperature, and this state can also be destroyed by passing too much electrical current through the material. The smallest electrical current which produces the onset of electrical resistance in a superconductor, is called its critical current. The critical current of a superconductor depends on the material from which it is made, on the temperature of that material, on the cross sectional shape of the material, and on its dimensions.

Conductors not in the superconducting state are said to be in the normal state. Electrical currents in wire made of normal metal are uniformly distributed across the cross section of the wire, if the current is at sufficiently low frequency. In contrast, current in a superconducting wire is almost exclusively in a very thin layer at the surface of the wire, for wire of ordinary diameter (0.1 mm or greater).

The magnetic field produced by this current is also constrained to this same thin surface layer, so far as its distribution within the superconducting material is concerned. The thickness of this layer is called the magnetic penetration depth. This depth is typically about 100 nm, but the depth depends upon temperature and varies with different superconducting materials. According to the two-fluid model of superconductors, the dependence of the penetration depth $\lambda$ on temperature is given by $$\lambda = \frac{\lambda_0}{\sqrt{1 - (T/T_c)^4}}, \; T < T_c, \quad (1)$$

where $\lambda_0$ is the penetration depth at temperature T equal to zero, and $T_c$ is the critical temperature.

Sufficiently large electrical currents in a superconductor, but less than the critical current defined above, may introduce magnetic vortices into the superconductor. These vortices are permanently circulating "whirlpools"[of electrical current, with diameters of about twice the magnetic penetration depth. The presence of vortices considerably complicates the electrical response of a superconductor. For example, the movement of vortices within the superconductor produces an effective nonzero electrical resistance on a transient basis, and also a transient change in inductance of the superconductor. Consequently, it is normally desirable to avoid the introduction of vortices into the superconductor in this invention.

The electrical current in a superconductor in the form of a long uniform ribbon is concentrated near the opposite edges of the ribbon, with relatively small current near the center of the ribbon. If the plane of this ribbon is located near to (in comparison with the width of the ribbon) and parallel with a superconducting ground plane, then the current is distributed essentially uniformly and exclusively across the surface of the ribbon that is closest to the ground plane.

If the thickness of the ribbon is one magnetic penetration depth or less, then, in the presence of the ground plane, the current will be distributed essentially uniformly across the cross section of the ribbon of superconductor. This uniform current distribution provides the maximum current carrying capacity for a superconducting thin film without the introduction of the magnetic vortices.

The temperature dependence of both the resistance and the inductance of superconductors have heretofore been used as the bases for thermometers. The resistance based thermometer is operated at temperatures just above its critical temperature, where the superconductor has a strongly temperature dependence resistance, and, in fact, this device is not superconducting at the operating temperature.

The inductance based thermometer, on the other hand, is operated just below its critical temperature, where it has zero resistance, and a strongly temperature dependent inductance. One advantage of the inductive device is that it has a lower noise level because it does not have Johnson noise since its resistance is zero.

It has also heretofore been foundthat higher sensitivity to temperature is obtained with the inductive device if the superconductor is made very thin, so that the kinetic inductance dominates the magnetic inductance (see W. A. Little, "Device Application of Super-inductors", Proceedings of the Symposium on the Physics of Superconducting Devices, 1967, pages S1–S17, and R. Meservey and P. M. Tedrow "Measurement of Kinetic Inductance of Superconducting Linear Structures", Journal of Applied Physics, volume 40, pages 2028–2034, (1969)). In this prior work, a single layer of thin film superconductor was used as the temperature sensor.

In the work of J. W. Baker, J. D. Lejeune, and D. G. Naugle, entitled "Effects of a nonuniform current distribution on the kinetic inductance of a thin superconducting film", appearing in the Journal of Applied Physics, Vol. 45, pages 5043-5049 (1974), the temperature dependence of the kinetic inductance of a thin film superconductor over a superconducting ground plane was studied. The ground plane, however, was not a thin film (the ground plane had a thickness of 1 mm), and the device could therefore not have the same practical applications as could a device with a thin film ground plane, as brought out hereinafter, particularly for devices requiring thermal isolation of one part of a superconductor circuit from other parts of the circuit. Economic differences also favor use of a thin film ground plane.

An inductive superconducting thermometer has also heretofore been developed using a wire wound construction for the device (see M. V. Moody, H. A. Chan, H. J. Paik, and C. Stephens, "A Superconducting Penetration Depth Thermometer", Proceedings of the 17th International Conference on Low Temperature Physics, edited by U. Eckern, A. Schmid, W. Weber, and H. Wuhl (North-Holland, Amsterdam), 1984, pages 407-408). This device was fabricated by winding superconducting wire around a superconducting rod. In this device, magnetic inductance was more important than kinetic inductance (which was not mentioned in the discussion).

Several different devices for detecting electromagnetic radiation are well known, and among such well known devices are bolometric detectors. A bolometric detector is basically a thermometer (heretofore usually made of a semi-conductor material rather than a superconductor material) in good thermal contact with a material that absorbs electromagnetic energy, such as microwaves. In the simplest model of a bolometer, the absorber and thermometer are normally considered to be at the same temperature, and they are jointly connected to a thermal reservoir by an appropriate thermal conductance G. The thermal conductance G plays an important role in determining the noise level and sensitivity of the overall device, and the internal noise and sensitivity of the thermometer play an important role in the performance of the detector.

An approximate relation between the radiation power absorbed by the bolometer $P_a$, and its change in temperature, is $$P_a = G(T - T_0), \qquad (2)$$

where G is the thermal conductance, T is the temperature of the absorber-thermometer combination with the radiation applied, and $T_0$ is their temperature without applied radiation. Thus, the measurement of power is reduced to a measurement of a change in temperature and a thermal conductance.

Bolometers have many applications, for example, the measurement of electrical and electromagnetic power across a very broad spectrum, ranging from audio frequencies through radio frequencies, microwaves, and millimeter waves, and encompassing the infrared and visible spectrum. Also, suitably designed bolometers based on the disclosed thermometer can measure the energy of optical and infrared pulses from lasers, and the energies of individual x-ray and $\gamma$-ray photons, as well as elementary charged particles, such as protons.

A substantial and generally unique advantage of bolometers over other radiation detectors is that they can be designed to be calibrated power detectors. This is achieved by applying a known amount of dc power to the device and comparing its response with that for the absorbed radiation power.

In practice, the main change for detecting or measuring one kind of radiation as opposed to another, is a change in the absorber. Metal films of gold-chromium alloys, with thicknesses less than 100 nm, are a representative material for absorbing infrared radiation. The shape and thickness of the absorbing film must be adjusted to give the appropriate impedance, reflection coefficient, or absorption of the applied radiation, and the area of the absorber must be adjusted with due consideration to power handling capability.

Modern day practice for circuit design frequently emphasizes the development of electronic circuitry in thin film form on a single substrate, called integrated circuits. The electrical components in circuits now fabricated in this way are not readily adjustable, and ordinarily the user must be content with the resistive, capacitive, and inductive components as they are fabricated. If different values are required, then the circuit heretofore had to be fabricated anew.

SUMMARY OF THE INVENTION

This invention provides an improved temperature sensing element that is superconductor-based. In this invention, the temperature dependence of the inductance of a multiple-layer thin film superconducting structure is utilized as the basis for the temperature sensor.

The device of this invention is operated at a temperature below the superconducting transition temperature where its inductance is substantially temperature dependent, and where the intrinsic electrical noise from the superconducting material is negligible, because it has essentially zero electrical resistance at the frequencies of the electrical currents used to measure the inductance of the structure. Low noise improves the sensitivity of the measurement system.

In its simplest form, the device of this invention is a superconducting stripline, comprised of a thin film superconducting ground plane, an overlaying thin film dielectric, and a second superconducting film atop the dielectric. The sensitivity of the device to temperature changes is best if the thickness of one or more of the superconducting thin films is substantially smaller than the magnetic penetration depth of the material.

The different superconducting layers of the device may have different critical temperatures, in which case, the device will ordinarily be operated at a temperature below the lowest critical temperature of the different critical temperatures.

For use of the basic structure as a temperature sensor, the multiple-layer thin film structure can, for example, be connected to instrumentation which is capable of sensing changes in inductance of the appropriate magnitude, and thereby detecting changes in temperature. More specifically, four similar stripline inductances can be connected in an impedance bridge configuration fabricated on a common substrate, and a superconducting amplifier (such as a superconducting quantum interference device) can be used as the null detector for the bridge.

To implement this arrangement, the common substrate for the bridge circuit is anchored to an essentially constant temperature reservoir, and provisions are made for relative thermal isolation, from the constant temperature reservoir, of one arm of the bridge. For a bridge having these features, the null detector will respond to any substantial heat that is applied to the thermally isolated arm of the bridge. Thus, this bridge configuration is sensitive to temperature differences within the bridge, or to temperature differences between objects thermally connected to the main body of the bridge and objects connected to the otherwise thermally isolated arm of the bridge. This general design is therefore particularly appropriate for a sensitive bolometer in which the radiation absorbing element for the bolometer is fabricated on the thermally isolated part of the substrate along with the superconducting inductance.

Another useful configuration is to incorporate the multiple-layer thin film structure inside a superconducting quantum interference device (SQUID) amplifier. The output signal of this amplifier depends in a periodic way on the magnetic flux that links its self inductance. With constant applied magnetic flux, the amplifier output will change if the self inductance of the SQUID is changed. Because of the relation between inductance and temperature for the superconducting stripline structure, the amplifier output is sensitive to the temperature of its structural elements, and the device acts as a thermometer. This arrangement is especially notable for its potentially small size (the combined sensor and amplifier can be as small as approximately 10 $\mu$m by 25 $\mu$m, for example) and its concomitantly relatively short response time. Such a small size means that the entire device could be fabricated, for example, along with a radiation absorber, on the end of an optical fiber.

In addition, when fabricated on a suitably thermally isolated substrate, the structure of this invention can provide a variable inductance device, which device can be compatible for integrated circuit usage.

It is therefore an object of this invention to provide an improved superconductor-based device.

It is another object of this invention to provide an improved temperature-sensitive multiple-layer thin film superconducting device.

It is still another object of this invention to provide an improved superconducting device that is operated at a temperature just below the transition temperature of the superconducting material utilized whereby the inductance of the superconductor is temperature dependent.

It is still another object of this invention to provide an improved superconducting device having first and second layers of superconducting material at least one layer of which is configurable and one layer of which is a ground plane, with the layers being separated by a dielectric layer disposed therebetween.

It is still another object of this invention to provide an improved superconducting device utilizing an impedance bridge circuit configuration formed of superconducting material.

It is still another object of this invention to provide an improved superconductor-based device useful for direct measurement of temperature.

It is yet another object of this invention to provide an improved superconductor-based device useful as a temperature sensitive measuring device to measure parameters such as radiation and/or power.

It is still another object of this invention to provide an improved superconductor-based device useful in conjunction with other superconducting elements such as an amplifier.

It is still another object of this invention to provide an improved superconducting device useful implementing electronic components such as variable inductors.

With these and other objects in view, which will become apparent to one skilled in the art as the description proceeds, this invention resides in the novel construction, combination, and arrangement of parts substantially as hereinafter described, and more particularly defined by the appended claims, it being understood that changes in the precise embodiments of the herein disclosed invention are meant to be included as come within the scope of the claims.

BRIEF DESCRIPTION OF THE DRAWINGS

The accompanying drawings illustrate complete embodiments of the invention according to the best mode so far devised for the practical application of the principles thereof, and in which:

FIG. 1A is a partial perspective view illustrating a simple superconducting stripline according to this invention for temperature sensing;

FIG. 1B is a cut-away perspective view illustrating a superconducting stripline within a cooling chamber for operation;

FIGS. 2A through C are schematic views illustrating typical monitoring of inductances of superconducting striplines;

FIG. 3 is a partial top perspective view illustrating an impedance bridge configuration utilized in this invention in a configurable layer of the stripline;

FIG. 4 is a schematic diagram illustrating the equivalent circuit for the bridge configuration shown in FIG. 3, and with a superconducting quantum interference device (SQUID) being utilized as a galvanometer;

FIG. 5 is a schematic view illustrating a simple bolometer according to this invention;

FIG. 6 is a perspective view illustrating a superconducting device according to this invention fabricated with a power absorber at an opposite side of a substrate;

FIG. 7 is a perspective view illustrating a stripline temperature sensor incorporated within a SQUID amplifier; and FIG. 8 is a partial perspective view illustrating use of a superconducting device according to this invention as a variable inductor.

DESCRIPTON OF THE INVENTION

A simple form of the multiple-layer thin film structure 10 of this invention is illustrated in FIG. 1A. As illustrated in FIG. 1B, structure 10 is normally within (or enclosed within) a cooling unit, or chamber 11 suitable for cooling the structure to a temperature needed for causing the conductors to act as superconductors and maintaining the needed temperature during normal operation. As brought out above, this can now be conventionally accomplished by cooling with liquid helium, liquid nitrogen, or mechanical refrigerators, and while not specifically illustrated, unit 11 could be a conventional unit, and could include piping and/or controls as would be needed for temperature control and maintenance, as would be readily apparent.

As also illustrated in FIG. 1A, a first conductive layer 13 of superconductor material is positioned at one side of a layer 15 of dielectric material, and a ground plane layer 17 of superconductor material is positioned at the opposite side of the layer of dielectric material. The superconductor layers are normally operationally related, and while either superconductor may be configurable as, for example, being patterned or formed as shown in FIGS. 2 and 3, the ground plane superconductor layer is normally not configured while the associated superconductor layer is configured.

By virtue of the intrinsic properties of superconductors, the electrical currents in the structure are essentially uniformly distributed in the two cross hatched regions 19 and 21 of the superconductor layers, and are essentially zero outside those regions. The relative directions of the currents are indicated in FIG. 1A by the arrows labelled I. As also indicated in FIG. 1A, a substrate 23 may also be provided to strengthen the stripline.

The current distribution in the upper, normally configurable, superconductor layer 13 (as shown in FIG. 1) has thickness $\pi_{up}$. In the lower, ground plane, superconductor layer 17, the current distribution has thickness $\pi_{gp}$, while, in both superconductor layers, the current distribution has essentially the same width W. These $\pi$s are the penetration depths within the two superconductor layers, and their dependence on temperature is given by equation (1).

The inductance of this structure is given by $$\alpha = \mu_0 \frac{L}{W} \left( s_0 + \lambda_{up} \coth \frac{s_{up}}{\lambda_{up}} + \lambda_{gp} \coth \frac{s_{gp}}{\lambda_{gp}} \right), \quad (3)$$

where $\mu_0$ is the permeability of free space; L is the length of the structure in the direction of the electrical current; and $s_{up}$, and $s_0$, and $s_{gp}$ are the thickness of the upper superconducting film, the dielectric film, and the ground plane film, respectively.

An important concept is that the relation between the inductance and the penetration depths of the superconductors is given by equation (3), while the temperature dependances of the penetration depths are given by equation (1). Together these equations give the temperature dependence of the inductance of the resulting superconducting stripline.

To illustrate the use of these formulas, consider a particular arrangement in which the upper and lower superconductors (as shown in FIG. 1A) are made of identical materials and both have thickness s, which is large compared with the penetration depth of that material. In this case, the penetration depths of both superconductors are designated siple $\pi$, and the inductance of the structure is $$\alpha = \mu_0 \frac{L}{W} (s_0 + 2\lambda), \quad s >> \lambda. \quad (4)$$

Thus, the inductance is proportional to $\pi$ which has the temperature dependence given by equation (1). With a typical $\pi$ of about 100 nm for a particular superconductor material, for example, a typical thickness (s) of the superconducting material could be about 500 nm.

Another interesting arrangement is that in which both the upper and ground plane superconductors are made of the same material, with the same thickness, but having a thickness s that is small compared with the penetration depth $\pi$. In this case, the inductance of the structure is given by $$= \mu_0 \frac{L}{W} \left( s_0 + \frac{2\lambda^2}{s} \right), \quad s << \lambda. \quad (5)$$

Here, the inductance is proportional to $\pi^2$, which means the inductance changes more rapidly with changes in $\pi$ and with changes in temperature. Consequently, the thermometer with very thin layers of superconductors will be the more sensitive design. By way of example, the thickness (s) in this arrangement could be about 20 nm.

When the inductance is proportional to $\pi^2$, as in equation (5), the superconductor is said to be in the kinetic inductance limit, which means that most of the energy storage in the inductance is in the kinetic energy of the electrons. Ordinarily most of the energy storage in an inductance is in the associated magnetic field. It is natural to refer to this thermometer as a kinetic inductance thermometer.

To implement a thermometer from the basic stripline structure, the structure is electrically connected to a suitable inductance measuring instrument. FIGS. 2A through 2C illustrate, by way of example, alternative ways of producing such a temperature sensing instrument. FIGS. 2A and 2B illustrate ways of electrically connecting an inductance measuring instrument, shown as inductance meter 25, to superconducting stripline structures 13A and 13B to measure their inductance and, thereby, monitor temperature.

In the configuration shown in FIG. 2A, electrical connectors, or leads, 27 and 29 connect inductance meter 25 to the opposite ends of configurable superconductor 13A. In the configuration shown in FIG. 2B, electrical connectors 27 and 29 connect inductance meter 25 to one end of configurable superconductor 13B and to ground plane superconductor 17. In the arrangement shown in FIG. 2B, the other end of configurable superconductor 13B is also electrically connected to ground plane superconductor 17, near the end remote from connection of superconductor 17 to inductance meter 25, by means of connector 31, as indicated. The inductance formulas, equations (3) to (5), apply to both arrangements of electrical connections as shown in FIGS. 2A and 2B.

FIG. 2C illustrates an elaboration of FIG. 2A. In this arrangement, impedance meter 33 is electrically connected to both ends of configurable superconductor 13A by leads 35 and 37. As shown, an additional dielectric layer 39 has been added, with dielectric layer 39 covering configurable superconductor 13A. A third superconducting thin layer, or film, 41 has also been added, and superconducting layer 41 is positioned over dielectric layer 39. This third layer 41 of superconductor is directly electrically connected to ground plane superconductor 17 by connector 43. The arrangement illustrated in FIG. 2C presents at least two additional advantages beyond those of the basic arrangements shown in FIGS. 2A and 2B.

First, any instrumentation is potentially subject to electrical and magnetic interference from extraneous sources in the environment, and, in some circumstances, the third layer of superconductor would be useful in shielding the underlying stripline from such interfering signals.

Second, it is recognized that a stripline structure, such as illustrated by FIG. 2A, is also a transmitting antenna. For simplicity, it is expected that the bias current in the structure for measuring its inductance would be at audio frequencies, for example, in which case the structure would probably have a length that was very short compared with the wavelength of the bias current. Thus, while it would not be an efficient radiator, it would nevertheless radiate at some low level. Such radiation represents power losses in the superconducting circuit, which are detrimental to its performance if, for example, it is a very sensitive thermometer. Consequently, a third superconducting layer which, along with the ground plane superconductor, very nearly completely encases the intermediate layer superconductor, would be useful for decreasing radiative losses of energy from the circuit. The inductance formulas, equations (3) to (5), would not apply to this configuration, but similar formulas can be derived for this arrangement.

In FIG. 3, a now preferred basic configuration 47 of the structure of this invention is shown for a thermometer, and, as indicated, this configuration is basically a bridge configuration. In this arrangement, there are four configured arms 49A, 49B, 49C and 49D (also referred to hereinafter as arms $Z_1$, $Z_2$, $Z_4$, $Z_3$, respectively) arranged as the arms of an impedance bridge. To make the design compact, the arms are configured as meander lines. The bridge is biased by a conventional current supply 51 providing current $I_b$. In principle, the frequency of the bias current is largely unrestricted, but for simplicity of description it can be assumed that the frequency is low compared with the lowest lying resonance of the bridge structure, specifically 100 kHz or less.

For best sensitivity, galvanometer (g) 53 for the bridge should ideally be a device with input impedance comparable to the impedance of one of the arms of the bridge. The now preferred form of galvanometer 53 is a superconducting quantum interference device (SQUID), which has good noise performance and can be made with an appropriate input impedance. FIG. 4 is an electrical equivalent schematic of the bridge circuit from the perspective of the galvanometer, which is taken to be a SQUID, with the bridge being replaced by its Thevenin equivalent circuit 55 with voltage source VTh and impedance $Z_{Th}$.

To complete the conceptual description of the bridge thermometer (as shown in FIG. 3), consider ground plane 17 to be thermally anchored to a constant temperature reservoir, except inside the two dashed regions 56 and 57, which are relatively thermally isolated from the reservoir, and assume that the inductances of each of the superconducting meander lines are the same at the same temperature. Thus, if all four arms of the bridge are at the same temperature, the galvanometer will indicate zero current, indicating that the bridge is balanced. If electrical power is now applied to either heater 59 or heater 61 (which heaters may be connected to conventional electrical power sources), their associated meander line inductors will be changed in temperature, the inductance will change, and the bridge will be unbalanced, as indicated by current in the galvanometer.

Bridge circuits have the desirable feature that, for equal arms, fluctuations of the temperature of the bridge as a whole do not cause an imbalance of the bridge. Thus, the bridge circuit will resolve temperature changes that are substantially smaller than the fluctuations of the thermal reservoir to which it is attached.

In the foregoing discussion, it has been assumed that the inductance of each arm of the bridge is the same if they are all at the same temperature. Practically, however, they cannot be made precisely the same because of imperfections in any fabrication process. To be assured that the bridge can be balanced regardless of small imperfections, two thermally isolated regions 56 and 57 with associated heaters 59 and 61 may be utilized. With this arrangement, either meander line 49A or meander line 49B can be increased in inductance by the application of heat to its associated thermally isolated region. Consequently, an intrinsic imbalance in either direction can be corrected. Alternatively, one arm of the bridge could be purposely made slightly larger than the others, so that the bridge could be brought to balance by applying heat to a specific arm designed for that purpose in advance.

The bridge thermometer, with a SQUID galvanometer, is now believed to be the best configuration for making the most sensitive thermometer by the suggested principles. A detailed analysis of its sensitivity is set forth hereinafter.

The bridge thermometer is easily converted to a bolometer as can be seen by referring to FIG. 3. As indicated, the thermally isolated island with arm 49A of the bridge has heater 59 associated therewith. The thermometer becomes a bolometer if, for example, heater 59 is replaced by a radiation absorber, or load, on the thermally isolated island.

FIG. 5 illustrates a basic arrangement for a bolometer. As shown, substrate 65 has a power absorber 67 at one side and a thermometer 69, according to this invention, at the other side. As also indicated, thermal reservoir 71 is connected with substrate 65 through thermal conductance G.

A practical way of achieving a bolometer, to detect incident power in a coaxial cable, for example, is shown in FIG. 6. As shown, thin silicon substrate 65 has a small region, or island, 75 that is thermally isolated from the other material because of a moat 77 that has been chemically etched into the silicon. The island is relatively thermally isolated if the depth of the moat is made slightly less than the thickness of the silicon substrate. A power absorbing material, such as resistive thin film metal, is connected with the island at load junction 79. As indicated, the absorber is electrically connected to the center conductor of a coaxial cable (not shown) at coax contact 81 by superconducting thin film 83, and the absorber is also similarly connected to the outer conductor of the coaxial cable by superconducting thin film 85. When appropriately contacting the end of the coaxial cable, the coaxial cable can deliver power to the load (connected at junction 79) and raise the temperature of the island.

The bridge thermometer is fabricated on the opposite side of thin silicon wafer 65 with a desirable configuration being, for example, with arm 49A aligned on the island and the remainder of the bridge well outside the moat. In this way, the bridge thermometer would sense heat delivered to the island by the load.

An alternate configuration incorporates the basic stripline structure inside a SQUID amplifier, as illustrated in FIG. 7, to make a very compact temperature sensor and preamplifier. As shown, a superconductor ground plane layer 89 has a substrate 91 at one side and a T-shaped layer 93 of dielectric at the other side, with layer 93 having a T-shaped superconductor layer 95 thereon. A SQUID bias current supply 97 is connected between the foot of T-shaped superconductor layer 95 and ground plane superconductor layer 89. In addition, a Josephson junction 99 is electrically connected between the superconductor layers 89 and one arm of T-shaped layer 95, and a second junction 101 is provided between the superconductor layer 89 and the other arm of T-shaped layer 95, with junctions 99 and 101 being separated a distance equal to the length of the temperature sensitive inductance.

Although the temperature response of the stripline component within the SQUID will be accurately described by the analysis presented above, the overall response of the combined temperature sensor and SQUID is not as simply calculated as in the bridge design. Nevertheless, it is clear that the combined device has a substantial temperature response, because the output of a SQUID depends on its internal inductance, which has now been made temperature dependent. Besides the fact that the combined temperature sensor and preamplifier can be very small, 10 $\mu$m by 25 $\mu$m in area for example, it is noted that small size implies that the device can have small thermal mass, and can therefore give a quick response. Also, small size allows the construction of such a device on the end of an optical fiber, where, when combined with a suitable absorber for the radiation in the fiber, it becomes a radiation detector.

Returning to the bridge configuration of FIG. 3, including the SQUID galvanometer, a more complete analysis is set forth of its properties in order to illustrate its unique properties. For simplicity, consider a stripline in which the upper, or configurable, superconductor has a high transition temperature and the ground plane superconductor has a much lower transition temperature $T_c(gp)$. With this line operating at temperature $T = 0.9T_c(gp)$, the dominant temperature dependence of the inductance will come from the ground plane. By making the dielectric thin (50 nm, for example) and the ground plane superconductor thin compared to its magnetic penetration depth, the inductance of $\nu$ of the superconducting stripline can be obtained from equation (3) as $$\alpha = \mu_0 \frac{L}{W} \lambda_{gp}^2 / s_{gp}, \quad s_{gp} << \lambda_{gp}, \tag{6}$$

which has the $\pi^2$ 2 dependence of a kinetic inductance thermometer.

While only a few meanders are illustrated in FIG. 3, it is to be realized that the lines would be constructed as long as needed for the particular utilization. In ideal form, the bridge and SQUID galvanometer are fabricated as an integrated circuit.

The temperature sensitivity of the bridge $\delta T$ is determined by the noise current in the galvanometer $\delta I_g$ when the bridge is balanced, as in the relation $$\delta T = \delta I_g / |dI_g/dT| \tag{7}$$

Thevenin's theorem is used to determine the effective voltage and impedance seen by the galvanometer, which are, respectively, $V_{Th} = I_b(Z_2Z_3 - Z_1Z_4)/\Sigma_i Z_i$ and $Z_{Th} = (Z_1 + Z_3)(Z_2 + Z_4)/\Sigma_i Z_i$. The impedance of each arm $Z_i$, $i = 1, 2, 3, 4$, is $j\omega L_i$. (Later, a very small resistance is added to each $Z_i$, but it has no significance here.)

Using the circuit of FIG. 4, and taking the impedance of the galvanometer to be $Z_g = j\omega L_g$, the galvanometer current $I_g$ and its derivative $dI_g/dZ_1$ can be calculated. The derivative may be increased by a factor of 2 in the analysis by setting $Z_1 = Z_4$ and $Z_2 = Z_3$, which is physically equivalent to applying heater 59 to both $Z_1$ and $Z_4$ and heater 61 to $Z_2$ and $Z_3$ Equation (6) is used to obtain $dZ_1/dT$, which combines with $dI_g/dZ_1$ to give $$\frac{dI_g}{dT} = \frac{-L_1/L_g}{(1 + L_1/L_g)} \frac{I_b}{T_c\lambda_{gp}} \frac{d\lambda_{gp}}{dt}, \tag{8}$$

at bridge balance. The reduced temperature $t = T/T_c$

This design can then be evaluated by comparing it with experimental results for a high quality millimeter wave bolometer (in particular the work of P. M. Downey, A. D. Jeffries, S. S. Meyer, R. Weiss, F. J. Bachner, J. P. Donnelly, W. T. Lindley, R. W. Mountain, and D. J. Silversmith, entitled "Monolithic silicon bolometers", appearing in Applied Optics, Vol. 23, No. 6, pages 910–914 (March 1984)). That bolometer was operated at a temperature of 0.35 K, so the kinetic inductance thermometer will be evaluated at that temperature. Since the operating temperature is to be $0.9T_c(gp)$, a superconductor with $T_c = 0.39$ K is needed for the ground plane. To be specific, it is known that cadmium (Cd) with a few percent of magnesium (Mg) has an appropriate $T_c$The $\pi_O$ for pure Cd is approximately 120 nm, and this value was used as a conservative estimate for the alloy since alloying tends to increase, $\lambda_O$. Material parameters were measured for bulk specimens and not thin films, and can therefore be viewed only as estimates.

Take $L/W = 2 \times 10^4$, which corresponds to a 5 $\mu$m wide meander line filling 1 mm$^2$ of area, and set $s_{gp}/\lambda_{gp} = 0.1$ for $T/T_c = 0.9$. From Equation (6), $L_1 = 0.052$ $\mu$H is obtained. A bias curren $I_b = 1$ mA rms is assumed. This current is limited by the critical field of the superconductor. To obtain a first result for temperature sensitivity, assume that a conventional dc SQUID is used as the null detector. Such devices have $\delta I_g = 1.5$ $pA\sqrt{Hz}$ and $L_g = 2.0$ $\mu$H. Using Equation (7), it is found that $\delta T = 5.4$ $nK\sqrt{Hz}$.

This result is interesting to compare with the temperature sensitivity of the millimeter wave bolometer, which is 290 nK/$\sqrt{Hz}$. This experimental result has been accounted for theoretically and includes noise sources not yet considered for the kinetic inductance thermometer up to this point. Nevrtheless, the conclusion that the kinetic inductance thermometer is theoretically more sensitive than- this semiconductor bolometer is correct, as is shown in greater detail hereinafter.

With respect to use of a nearly optimized SQUID in the thermometer, parameters for a quantum limited SQUID are described, the SQUID input inductance $L_g$ is optimized, and the temperature sensitivity of the resulting thermometer is computed. With respect to noise, it is desirable to include the thermometers very small Johnson noise, which is accomplished by adding the very small residual resistance $R_s$ of the superconductor to the circuit. Thus, in FIG. 3(b), $Z_{Th}(=Z_1)$ is now taken to be $R_s + j\omega L_1$. The SQUID is described by parameters corresponding to quantum limited performance as computed by Koch et al (see R. H. Koch, D. J. Harlingen, and J. Clarke, "Quantum noise theory for the dc SQUID", Applied Physics Letters, Vol 38 (5), pages 380–382 (March 1981)). These parameters are the noise spectral densities $S_V - 0.30\phi_o I_o R/(2\pi)$, $S_J = 0.15\pi_o I_O/(2\pi R)$, and $S_{VJ} = 0.20\phi_O I_O/(2\pi)$, and the derivative of the SQUID output voltage with respect to applied flux $V_\phi = 7.3 I_O R/\phi_O$, where $\phi_O$ is the flux quantum and $I_O$ and R are the critical current and resistance, respectively, of each of the Josephson junctions.

The quantum limited SQUID parameters given above were derived for a SQUID without an input circuit. With an input circuit, in particular the input circuit of FIG. 4, the performance can be deduced. The energy sensitivity of this circuit is the energy $U_0$ that must be supplied to the inductance $L_1$ to produce a SQUID output signal to noise ratio of 1 in a unit bandwidth. The noise in the circuit is the Johnson noise of $R_s$ and the amplifier noise. Thus $$U_0 = \frac{2k_B}{\omega Q_s}(T_s + T_{sq}), \qquad (9)$$

where $k_B$ is Boltzmann's constant, $Q_s = \omega L_1/R_s$ is the Q of the inductance $L_1$, $T_s$ is the temperature of the ground plane (i.e., of $R_s$), and $T_{sq}$ is the noise temperature of the SQUID amplifier. Optimization of the energy sensitivity with respect to variations of $L_g$ gives a relation between $L_g$ and $L_1$ of $L_g$(opt.)$/L_1 = 0.443$.

The expression for the optimum energy sensitivity is the sum of two parts: $U_0$(opt.)$= U_1 + U_2$(opt.), where the first part is just the $T_s$ term from Equation (9) (there is no optimization of this term), and the second is the optimized amplifier noise term. Hence, the latter is approximately $$U_2(\text{opt.}) = \frac{S_V}{\alpha^2 L V_\phi^2}\left[1 + \frac{L_1}{L_g(\text{opt.})} + \frac{\alpha^2 L V_\phi S_{VJ}}{S_V}\right]. \qquad (10)$$

In this equation $\alpha$ is the coupling coefficient given by $\alpha^2 M^2/(LL_g)$, where M is the mutual inductance between $L_g$ and the SQUID loop inductance L. Setting $\alpha^2 = 0.5$ and using the Koch et al. values for the SQUID parameters, listed above, $U_2$(opt.)$=16n$ is the approximate result. (with $\alpha^2=1$ the result is $U_2$(opt.)$=13n$.)

The Johnson noise contribution to the energy sensitivity is $U_1$, which requires an evaluation of $Q_s$, the Q of the ground plane superconductor. Only the ground plane is involved because it is the only superconductor near its critical temperature. An estimate of Q can be obtained from the two fluid model of a superconductor. Using $\sigma_n = 1.33 \times 10^7 \Omega^{-1} m^{-1}$ for the normal state conductivity of the Cd alloy, $Q_s = 2.2 \times 10^{12}/\omega$, so the required quantity in $U_1, \omega Q_s$, is independent of frequency $\omega$. The contribution of $U_1$ to $U_0$(opt.) is less than $0.05n$.

Although the noise contribution of the residual resistance of the superconductor is negligible, other physical loss mechanisms such as radiation and dielectric losses must also be considered. If the bridge circuit is operated at an audio frequency, radiation losses will be very small, and if necessary, can be further reduced by encasing the circuit tightly in a superconducting enclosure.

Dielectric losses can be analyzed in a form similar to that for losses in the superconductor. For this case $\omega Q_s$ in $U_1$ should be replaced by $\omega Q_d$, where $Q_d$ is the Q of the dielectric. The dielectric SiO, which is commonly used in superconducting microstrip lines, has a high Q, but experiments have given only a lower bound value, i.e., $Q_d > 10^5$. Assuming that the bridge is operated at a frequency of 100 kHz (to reduce SQUID 1/f noise), the $Q_d$ required to produce a dielectric noise contribution that is negligibly small, say n, can be estimated. That value is $Q_d = 1.5 \times 10^5$, which is near the lower bound value given above.

Consequently, the Johnson noise contribution to $U_0$ is negligible and the estimate $U_0 = 16n$ is used. An effective SQUID input noise current can be calculated from the relation $U_0 = L_1(\delta I_g)^2/2$, using Equation (7), the equivalent temperature noise $\delta T = 0.034$ $nK/\sqrt{Hz}$ is found. This result is a factor of about 160 improvement over the thermometer with the commercial SQUID, which has already been found to be significantly quieter than the semiconductor thermometer.

The conclusion to be drawn is that superconducting technology provides practically unlimited temperature resolution if the only noise sources are the Johnson noise of the thermometer and preamplifier noise, the sources included in $U_0$.

Practical bolometers have other noise sources, and their sensitivity is described by their electrical noise equivalent power (NEP$_e$), its relation to temperature sensitivity being NEP$_e = G\delta T$, where G is the thermal conductance (with units W/K) between the bolometer and its thermal reservoir. It has been found that NEP$_e$ has just three physical contributions: thermal fluctuations of the bolometer (phonon noise), Johnson noise, and amplifier noise.

A measured quoted NEPe$=6.1\times10^{-16}$ W/$\sqrt{Hz}$ (for $G=2.09\times10^{-9}$ W/K) for a semiconductor millimeter wave bolometer is predominantly attributable to the latter two sources. Compare the part of this NEP$_e$ that originates from Johnson noise and amplifier noise $(6.0\times10^{-16}$ W/$\sqrt{Hz})$ with equivalent results for the superconducting device. Using the same G value with the superconducting device, NEP$_e = G\delta T = 7\times10^{-20} =$ W/$\sqrt{Hz}$, which is an improvement of about 4 orders of magnitude over the semiconductor device.

However, if the phonon noise of the mount is added to the description of the superconducting device, then the overall NEP$_e$ is dominated by the phonon noise, i.e., NEP$_e = \sqrt{4k_BT^2G} = 1.2\times10^{-16}$ W/$\sqrt{Hz}$. This is about a factor of 5 improvement over the semiconductor device. Thus, it is quite clear that the full advantages of superconducting methods can be realized only with bolometers of reduced thermal conductance.

Beyond the general sensitivity considerations, a bolometer that is relatively unlimited by Johnson noise is also interesting for applications in which a high radiation chopping frequency is desirable, since the effective Johnson noise rises with chopping frequency, as was shown in a discussion of X-ray bolometers. Finally, a thermometer with energy sensitivity that is nearly quantum limited could provide a means for detecting a very small number of phonons.

Use of a superconducting device according to this invention as a variable inductance is illustrated in FIG. 8. As shown, the variable inductance is provided by superconductor inductance 105 (which may be formed by a stripline in the same manner as illustrated in FIG. 3 with the stripline including a configurable superconductor formed by a meander line, a ground plane superconductor and a dielectric layer between the superconductors as described in FIG. 3). By varying the heat supplied to inductance 105 by associated heater 107 (as, for example, by connecting heater 107 to variable power supply 109), the inductance can be made heat-variable. If inductance 105 is made, for example, a part of conventional oscillator circuit 111, then the output frequency of the oscillator is temperature dependent.

As can be appreciated from the foregoing, this invention is directed to superconductor-based devices that are temperature-sensitive and formed by multilayers that include superconductors separated from one another by a dielectric to thereby provide better sensitivity than has been heretofore realized.

What is claimed is:

1. A temperature-sensitive superconducting device, comprising:
    a sensor having at least two operationally interacting spaced layers of thin film superconducting material, said spacEd layers being separated by a dielectric, and said sensor being operated at a sufficiently low tempErature such that saiD sensor has an inductance that is temperature dependent based upon a magnetic penetration depth of said superconducting material whereby, when operated at said low temperature, said sensor exhibits an inductance based upon temperature so that said device provides a temperature indicative output.

2. The device of claim 1 wherein said dielectric is a layer of dielectric material having said spaced layers of said superconducting material at opposite sides thereof.

3. The device of claim 2 wherein said device includes a third layer of superconducting material and a second layer of dielectric material positioned between said third layer of superconducting material and one of said spaced layers of superconducting material.

4. The device of claim 2 wherein said layer of dielectric material is also a thin film.

5. The device of claim 1 wherein one of said layers of superconducting material is configurable, and wherein the other of said layers of superconducting material is a ground plane.

6. The device of claim 5 wherein said configurable layer of superconducting material includes a plurality of arms forming an impedance bridge.

7. The device of claim 1 wherein said device includes utilization means connected with said sensor to receive said temperature indicative output therefrom.

8. The device of claim 7 wherein said utilization means is a meter.

9. The device of claim 7 wherein said utilization means is connected with both of said layers of superconducting material.

10. The device of claim 1 wherein said device includes amplifier means.

11. The device of claim 10 wherein said amplifier means is a superconducting quantum interference device.

12. The device of claim 11 wherein said device is a part of said superconducting quantum interference device.

13. The device of claim 1 wherein said device includes means for connecting said sensor with electronic circuit means such that said sensor provides a variable inductance for said electric circuit means.

14. The device of claim 13 wherein said electronic circuit means includes oscillation means providing an output the frequency of which is inductively controlled, and wherein said sensor provides inductance to said oscillation means the magnitude of which inductance varies with temperature whereby the output frequency of said oscillation means is temperature dependent.

15. The device of claim 1 wherein said device includes means for connecting said sensor with monitoring means capable of monitoring at least one of power and radiation whereby said device produces a temperature-sensitive indicative output that is indicative of at least one of power and radiation montiored by said monitoring means.

16. The device of claim 1 wherein said sensor senses temperature differences and provides an output indicative thereof.

17. In a superconductor-based system utilizing temperature variations, a stripline sensing unit comprising:
    an impedance bridge circuit having a plurality of arms formed from superconcduting material;
    a ground plane formed form supeconducting material;
    a layer of dielectric material positioned between said impedance bridge circuit and said ground plane;
    conducting means for varying the temperature sensed by at least one of said arms of said impedance bridge circuit;
    power means for enabling electrical power to be supplied to said impedance bridge circuit;
    output means connected with said impedance bridge circuit to provide an electrical output from said sensing unit; and
    means for causing said sensing unit to be operated at a temperature wherein the inductance of said impedance circuit is temperature dependant based upon a magnetic penetration depth of said superconducting material whereby said sensing unit exhibits a temperature indicative output signal at said output means.

18. The device of claim 17 wherein said sensing unit also includes an additional layer formed from superconducting material, and an additional layer of dielectric material positioned between said additional layer formed from superconducting material and said impedance bridge.

19. A superconductor-based detection device, comprising:
    asorbing means capable of absorbing at least one of radiation and power from an emitting source and, responsive thereto, causing a temperature change of said absorbing means; and
    sensing means formed by a first section of superconducting material having first and second portions, a ground plane section of superconducting material, and a middle section of dielectric material positioned between said first and ground plane sections, said sensing means being operable at a temperature such that the inductance of the sensing means is temperature dependent, said first portion of said first section of said superconducting material being positioned with respect to said absorbing means so as to be responsive to temperature changes thereof, and said sensing means exhibiting an inductance that provides an output accurately indicative of said at least one of radiation and power from said emitting source.

20. The device of claim 19 wherein said first section, said ground plane section, and said middle section are thin layers of material.

21. The device of claim 20 wherein said magnetic penetration depth within at least one of said first and ground plane sections is greater than the thickness of said sections, such that, in the presence of said ground plane, current is distributed essentially uniformly across the cross section of said first section to thereby provide substantially maximum current carrying capability for said superconducting thin film without introduction of magnetic vortices.

22. The device of claim 19 wherein said first section is configured as an impedance bridge circuit having a plurality of arms forming said first and second portions, one arm of said first section being positioned so as to be responsive to said temperature changes of said absorbing means.

23. The device of claim 19 wherein said device is operated at a temperature just below the lowest transition temperature of said superconducting materials.

24. The device of claim 19 wherein said device includes substrate means having said absorbing means at one side of said sensing means at the other side.

25. The device of claim 24 wherein said substrate means has a moat section with an island thereat whereby said substrate is adapted for connection to a coaxial cable.

* * * * *

UNITED STATES PATENT AND TRADEMARK OFFICE
CERTIFICATE OF CORRECTION

PATENT NO. : 4,869,598

DATED : September 26, 1989

INVENTOR(S) : McDonald

It is certified that error appears in the above-identified patent and that said Letters Patent is hereby corrected as shown below:

Column 1, line 5, "INVENTIN" should be --INVENTION--.

Column 2, line 14, after "pools" delete --[--.

Column 7, line 17, "$\pi$" should be --$\lambda$--.

Column 7, line 19, "$\pi$" should be --$\lambda$--.

Column 7, line 20, "$\pi$s" should be --$\lambda$s--.

Column 7, line 30, "$\alpha$" should be --$\zeta$--.

Column 7, line 51, "$\pi$" should be --$\lambda$--.

Column 7, line 51, "siple" should be --simply--.

Column 7, line 52, after "is" insert --given by--.

Column 7, line 55, "$\alpha$" should be --$\zeta$--.

Column 7, line 56, "$\pi$" should be --$\lambda$--.

Column 7, line 67, "$\pi$" should be --$\lambda$--.

UNITED STATES PATENT AND TRADEMARK OFFICE
CERTIFICATE OF CORRECTION

PATENT NO. : 4,869,598

DATED : September 26, 1989

INVENTOR(S) : McDonald

It is certified that error appears in the above-identified patent and that said Letters Patent is hereby corrected as shown below:

Column 8, line 6, "$\pi^2$" should be --$\lambda^2$--.

Column 8, line 7, "$\pi$" should be --$\lambda$--.

Column 8, line 13, "$\pi^2$" should be --$\lambda^2$--.

Column 8, line 26, after "illustrate" insert --alternative--.

Column 9, line 24, after "Z4" insert --and--.

Column 11, line 40, "v" should be --$\int$--.

Column 11, line 45, "$\alpha$" should be --$\int$--.

Column 11, line 46, "$\pi^2$" should be --$\lambda^2$--.

Column 12, line 26, "$\pi$" should be --$\lambda$--.

Column 12, line 35, "curren" should be --current--.

Column 12, line 47, "Nevrtheless" should be --Nevertheless--.

Column 12, line 67, "spectural" should be --spectral--.

Column 12, line 67, "-" should be --=--.

Column 12, line 68, "$\pi$", first occurrence, should be --$\phi$--.

Column 12, line 26, after "T$_c$" insert a --.--

Column 13, line 68, "n" should be -- $\hbar$ --.

Column 14, line 7, " /H$_z$" should be -- $\sqrt{H_z}$ --.

UNITED STATES PATENT AND TRADEMARK OFFICE
CERTIFICATE OF CORRECTION

PATENT NO. : 4,869,598

DATED : September 26, 1989

INVENTOR(S) : McDonald

It is certified that error appears in the above-identified patent and that said Letters Patent is hereby corrected as shown below:

Column 13, line 40, "16n" should be --$16\hbar$--.

Column 13, line 41, "13n" should be --$13\hbar$--.

Column 13, line 51, "5n" should be --$5\hbar$--.

Column 14, line 4, "16n" should be --$16\hbar$--.

Column 14, line 26, "$\sqrt{Hz}$" should be --$\sqrt{Hz}$--.

Column 14, line 31, "$\sqrt{Hz}$" should be --$\sqrt{Hz}$--.

Column 14, line 34, "$\sqrt{Hz}$" should be --$\sqrt{Hz}$--.

Column 14, line 40, "$\sqrt{4K_B T^2 G}$" should be --$\sqrt{4K_b T^2 G}$--.

Column 14, line 40, "$\sqrt{Hz}$" should be --$\sqrt{Hz}$--.

Column 16, line 2, "montiored" should be --monitored--.

Column 16, line 10, "supercondcuting" should be --superconducting--.

UNITED STATES PATENT AND TRADEMARK OFFICE
CERTIFICATE OF CORRECTION

PATENT NO. : 4,869,598

DATED : September 26, 1989

INVENTOR(S) : McDonald

It is certified that error appears in the above-identified patent and that said Letters Patent is hereby corrected as shown below:

Column 16, line 11, "supeconducting" should be --superconducting--.

Signed and Sealed this

Twenty-fifth Day of June, 1991

Attest:

*Attesting Officer*

HARRY F. MANBECK, JR.

*Commissioner of Patents and Trademarks*